(12) United States Patent
Adachi et al.

(10) Patent No.: US 6,867,538 B2
(45) Date of Patent: Mar. 15, 2005

(54) DOUBLE DOPED-LAYER, PHOSPHORESCENT ORGANIC LIGHT EMITTING DEVICES

(75) Inventors: Chihaya Adachi, Hokkaido (JP); Marc A. Baldo, Princeton, NJ (US); Stephen R. Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 10/087,417

(22) Filed: Mar. 1, 2002

(65) Prior Publication Data

US 2002/0180347 A1 Dec. 5, 2002

Related U.S. Application Data

(60) Provisional application No. 60/273,284, filed on Mar. 2, 2001.

(51) Int. Cl.[7] .................................................. H01J 1/62
(52) U.S. Cl. ........................ 313/503; 313/504; 313/506
(58) Field of Search ................................. 313/503, 504, 313/506; 428/690, 917; 257/102, 103

(56) References Cited

U.S. PATENT DOCUMENTS

| | | | |
|---|---|---|---|
| 5,093,698 A | 3/1992 | Egusa | |
| 5,703,436 A | 12/1997 | Forrest et al. | |
| 5,707,745 A | 1/1998 | Forrest et al. | |
| 6,013,538 A | 1/2000 | Burrows et al. | |
| 6,097,147 A | * 8/2000 | Baldo et al. ................ | 313/506 |
| 6,287,712 B1 | 9/2001 | Bulovic et al. | |
| 6,303,238 B1 | 10/2001 | Thompson et al. | |
| 6,420,031 B1 | 7/2002 | Parthasarathy et al. | |
| 6,469,437 B1 | 10/2002 | Parthasarathy et al. | |
| 6,614,175 B2 | * 9/2003 | Aziz et al. .................. | 313/504 |
| 6,645,645 B1 | 11/2003 | Adachi et al. | |
| 6,696,177 B1 | * 2/2004 | Hatwar ....................... | 428/690 |

OTHER PUBLICATIONS

Y. Kunugi, et al., "A Vapochromic LED", *J. Am. Chem. Soc.*, vol. 120, No. 3, pp. 589–590, 1998.

M. A. Baldo, et al., "Highly efficient phosphorescent emission from organic electroluminescent devices," Nature, Sep. 1998, vol. 395, pp. 151–154.

D.F. O'Brien, et al., "Improved energy transfer in electrophosphorescent devices", *Applied Physics Letters*, vol. 74, No. 3, pp. 442–444, (Jan. 18, 1999).

M.A. Baldo, et al., "Very high–efficiency green organic light–emitting devices based on electrophosphorescence", Applied Physics Letters, vol. 75, No. 1, pp. 4–6, Jul. 5, 1999.

T. Tsutsui et al., "High quantum efficiency in organic light-emitting devices with iridium–complex as a triplet emissive center", Japanese. J. Appl. Phys., Part 2, No. 12B, vol. 38, pp. L1502–1504 (Dec. 15, 1999).

C. Adachi, et al., "High–efficiency organic electrophosphorescent devices with tris(2–phenylpyridine) iridium doped into electron–transporting materials", App. Phys. Lett, vol. 77, No. 6, pp. 904–906, (Aug. 7, 2000).

(List continued on next page.)

*Primary Examiner*—Edward J. Glick
*Assistant Examiner*—Elizabeth Keaney
(74) *Attorney, Agent, or Firm*—Kenyon & Kenyon (57) ABSTRACT

Phosphorescent OLEDs having a double doped-layer structure wherein the OLEDs include a hole transporting layer (HTL) having a phosphorescent material doped therein, and an electron transporting layer (ETL) having the same phosphorescent material doped therein. Typically, these phosphorescent OLEDs have an anode, a first HTL over the anode, a second HTL that is doped with a phosphorescent material over the first HTL, a first ETL that is doped with a phosphorescent material over the second HTL, a second ETL over the first ETL, and a cathode over the second ETL. These phosphorescent OLEDs preferably include blue phosphorescent OLEDs with high efficiency levels.

44 Claims, 5 Drawing Sheets

OTHER PUBLICATIONS

M. J. Yang et al., "Use of Poly(9–vinylcarbazole) as host material for iridium complexes in high–efficiency organic light emitting devices", Japanese J. Appl. Phys., Part 2, No. 8A, vol. 39, pp. L828–829 (Aug. 1, 2000).

C. L. Lee et al., "Polymer phosphorescent light–emitting devices doped with tris(2–phenylpyridine) iridium as a triplet emitter", Appl. Phys. Lett, vol. 77, No. 15, pp. 2280–2282 (Oct. 9, 2000).

U.S. Appl. No. 09/629,335, filed Aug. 1, 2000 entitled "Phosphorescent Organic Light Emitting Devices".

U.S. Appl. No. 09/637,766, filed Aug. 11, 2000 entitled "Organometallic Platinum Complexes for Phosphorescence Based Organic Light Emitting Devices".

U.S. Appl. No. 08/964,863, filed Nov. 5, 1997, entitled "A Highly Transparent Organic Light Emitting Device Employing A Non–Metallic Cathode".

U.S. Appl. No. 09/054,707, filed Apr. 3, 1998, entitled "Highly Transparent Non–Metallic Cathodes".

\* cited by examiner

DOUBLE DOPED-LAYER, PHOSPHORESCENT ORGANIC LIGHT EMITTING DEVICES

The present application claims the benefit, under 35 U.S.C. §119(e) of U.S. Provisional Application No. 60/273,284, filed on Mar. 2, 2001.

GOVERNMENT RIGHTS

This invention was made with Government support under Contract No. F49620-92-1-0277 awarded by Air Force Office of Scientific Research. The government has certain rights in this invention.

RESEARCH AGREEMENTS

The claimed invention was made by, on behalf of, and/or in connection with one or more of the following parties to a joint university-corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention is directed to double doped-layer, phosphorescent organic light emitting devices that are, for example, capable of emitting blue light. The present invention is directed to, for example, an organic light emitting device (OLED) over a substrate, where the OLED has an anode, a first hole transporting layer (HTL), a second hole transporting layer that is doped with a phosphorescent material, a first electron transporting layer (ETL) that is doped with a phosphorescent material, a second electron transporting layer, and a cathode.

BACKGROUND OF THE INVENTION

Organic light emitting devices (OLEDs), which make use of thin film materials that emit light when excited by electric current, are expected to become an increasingly popular form of flat panel display technology. This is because OLEDs have a wide variety of potential applications, including cell phones, personal digital assistants (PDAs), computer displays, informational displays in vehicles, television monitors, as well as light sources for general illumination. Due to their bright colors, wide viewing angle, compatibility with full motion video, broad temperature ranges, thin and conformable form factor, low power requirements and the potential for low cost manufacturing processes, OLEDs are seen as a future replacement technology for cathode ray tubes (CRTs) and liquid crystal displays (LCDs), which currently dominate the growing $40 billion annual electronic display market. Due to their high luminous efficiencies, electrophosphorescent OLEDs are seen as having the potential to replace incandescent, and perhaps even fluorescent, lamps for certain types of applications.

Light emission from OLEDs is typically via fluorescence or phosphorescence. As used herein, the term "phosphorescence" refers to emission from a triplet excited state of an organic molecule and the term "fluorescence" refers to emission from a singlet excited state of an organic molecule.

Successful utilization of phosphorescence holds enormous promise for organic electroluminescent devices. For example, an advantage of phosphorescence is that all excitons (formed by the recombination of holes and electrons in an emissive layer), which are formed either as a singlet or triplet excited state, may participate in luminescence. This is because the lowest singlet excited state of an organic molecule is typically at a slightly higher energy than the lowest triplet excited state. This means that, for typical phosphorescent organometallic compounds, the lowest singlet excited state may rapidly decay to the lowest triplet excited state from which the phosphorescence is produced. In contrast, only a small percentage (about 25%) of excitons in fluorescent devices are capable of producing the fluorescent luminescence that is obtained from a singlet excited state. The remaining excitons in a fluorescent device, which are produced in the lowest triplet excited state of an organic molecule, are typically not capable of being converted into the energetically unfavorable higher singlet excited states from which the fluorescence is produced. This energy, thus, becomes lost to radiationless decay processes that only tend to heat-up the device.

As a consequence, since the discovery that phosphorescent materials can be used as the emissive material in highly efficient OLEDs, there is now much interest in finding still more efficient electrophosphorescent materials and OLED structures containing such materials.

High efficiency organic light emitting devices (OLEDs) using the phosphorescent dopant,fac tris(2-phenylpyridine) iridium ($Ir(ppy)_3$), have been demonstrated using several different conducting host materials. M. A. Baldo et al., Nature, vol. 395, 151 (1998); D. F. O'Brien et al., Appl. Phys. Lett., vol. 74, 442 (1999); M. A. Baldo et al., Appl. Phys. Lett., vol. 75, 4 (1999); T. Tsutsui et al., Japanese. J. Appl. Phys., Part 2, vol. 38, L1502 (1999); C. Adachi et al., Appl. Phys. Lett., vol. 77, 904 (2000); M. J. Yang et al., Japanese J. Appl. Phys., Part 2, vol. 39, L828 (2000); and C. L. Lee et al., Appl. Phys. Lett., vol. 77, 2280 (2000). Since the triplet level of the metal-ligand charge transfer state of the green-emitting $Ir(ppy)_3$ is between 2.5 eV and 3.0 eV, deep blue fluorophores with a peak wavelength at about 400 nm, such as 4,4'-N,N'-dicarbazole-biphenyl (CBP), are likely candidates as triplet energy transfer and exciton confining media. Using 6% to 10%-$Ir(ppy)_3$ in CBP leads to efficient $Ir(ppy)_3$ phosphorescence. In addition to the energetic resonance between the dopant and the host, the control of charge carrier injection and transport in the host layers is believed to be necessary for achieving efficient formation of radiative excitons. High electrophosphorescence efficiency has been achieved using $Ir(ppy)_3$ doped into CBP along with a 2,9-dimethyl-4,7-diphenyl-phenanthroline (BCP) electron transport and exciton blocking layer. M. A. Baldo et al., Appl. Phys. Lett., vol. 75, 4 (1999). In that device, the doped CBP layer was found to readily transport holes.

Current materials used in phosphorescent OLEDs may be used to form devices with internal quantum efficiencies of near 100%. However, the materials used to form the hole transporting, recombination and blocking layers in these conventional devices tend to have triplet energies corresponding to emission in the green part of the spectrum. If a dopant capable of producing blue phosphorescence is inserted in such a device utilizing the existing materials and structures, the emission will only come, if at all, inefficiently from the matrix material, and not from the phosphorescent dopant material. Accordingly, there is great interest in finding efficient OLED structures that can emit in the blue region of the visible electromagnetic spectrum.

SUMMARY OF THE INVENTION

The present invention is directed to phosphorescent OLEDs having a double doped-layer structure. The OLEDs of the present invention typically have an anode, a first hole transporting layer (HTL) over the anode, a second HTL that is doped with a phosphorescent material over the first HTL, a first electron transporting layer (ETL) that is doped with a phosphorescent material over the second HTL, a second ETL over the first ETL, and a cathode over the second ETL. In each embodiment of the present invention, the OLED includes an HTL having a phosphorescent material doped therein, and an ETL having the same phosphorescent material doped therein.

The present invention is directed to phosphorescent OLEDs having a double doped-layer structure that preferably emit light in the blue range of the visible spectrum. The phosphorescent OLEDs of the present invention preferably include blue phosphorescent OLEDs with high efficiency levels.

DETAILED DESCRIPTION

The present invention will be described with reference to the illustrative embodiments in the following description. These embodiments are intended only as illustrative examples and the invention is not to be limited thereto.

Figure 3:
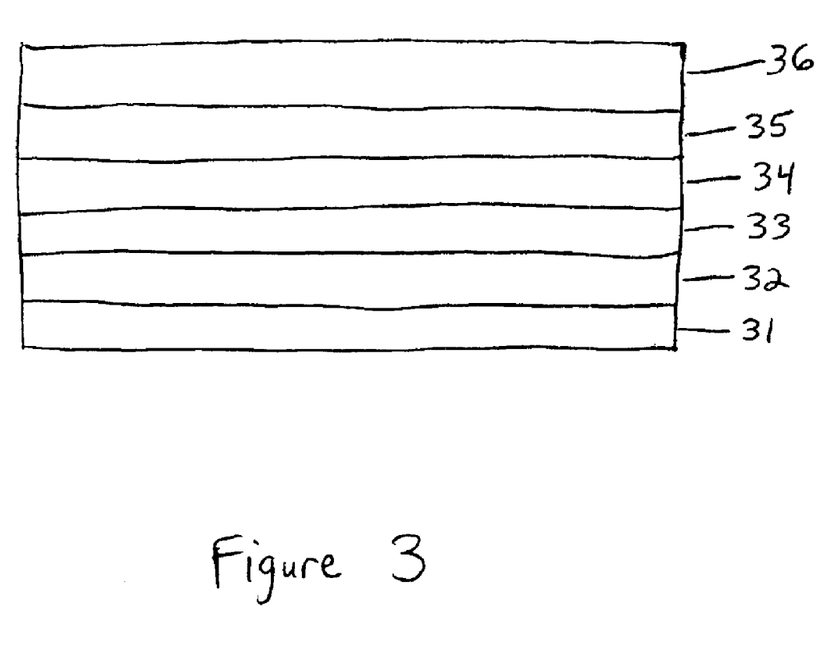
FIG. 3 is a schematic representation of an embodiment of an OLED according to the present invention.

The present invention relates to a phosphorescent organic light emitting device (OLED) having a double doped-layer structure. That is, in each embodiment of the present invention, the OLED includes a hole transporting layer (HTL) having a phosphorescent material doped therein, and an electron transporting layer (ETL) having the same phosphorescent material doped therein. For example, as shown in FIG. 3, an embodiment of an OLED of the present invention can be comprised of an anode 31, a first HTL 32, a second HTL 33 that is doped with a phosphorescent material, a first ETL 34 that is doped with a phosphorescent material, a second ETL 35 and a cathode 36. According to the present invention, the phosphorescent dopant of the hole transporting layer is the same material as the phosphorescent dopant of the electron transporting layer. The material constituting the first HTL need not be the same material as that constituting the second HTL, and the material constituting the first ETL need not be the same material as that constituting the second ETL. As would be understood by one skilled in the art, a hole transporting material is one in which charge carrier transport is predominantly by the transport of holes and an electron transporting material is one for which charge carrier transport is predominantly by the transport of electrons.

Figure 4:
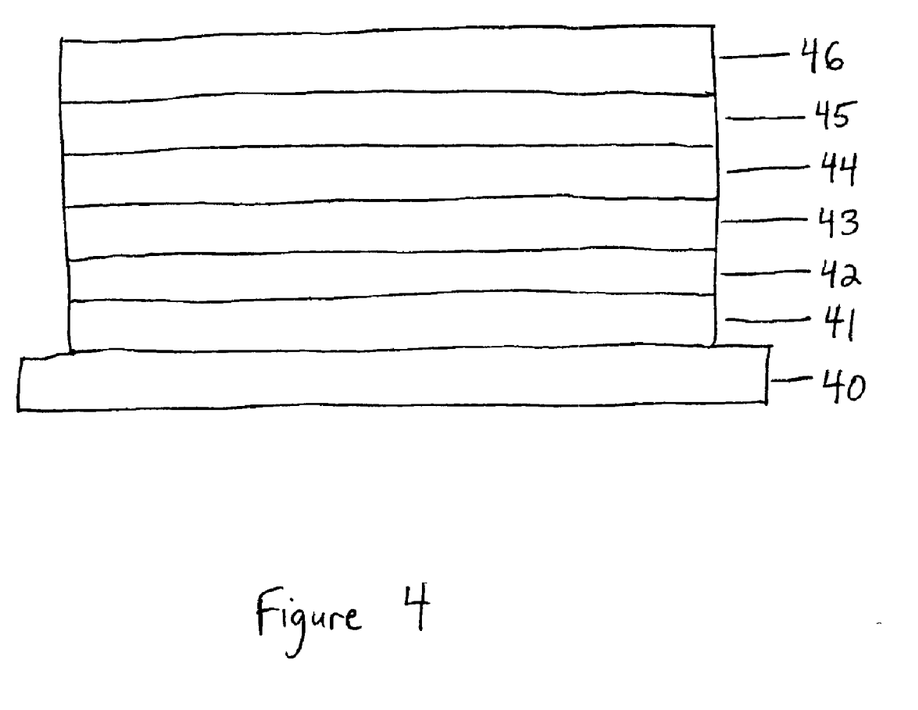
FIG. 4 is a schematic representation of another embodiment of an OLED according to the present invention.

In one embodiment of the present invention, as shown in FIG. 4, the OLED structure includes a substrate 40, an anode 41 over the substrate 40, a first HTL 42 over the anode 41, a second HTL 43 that is doped with a phosphorescent material over the first HTL 42, a first ETL 44 that is doped with a phosphorescent material over the second HTL 43, a second ETL 45 over the first ETL 44, and a cathode 46 over the second ETL 45.

Figure 5:
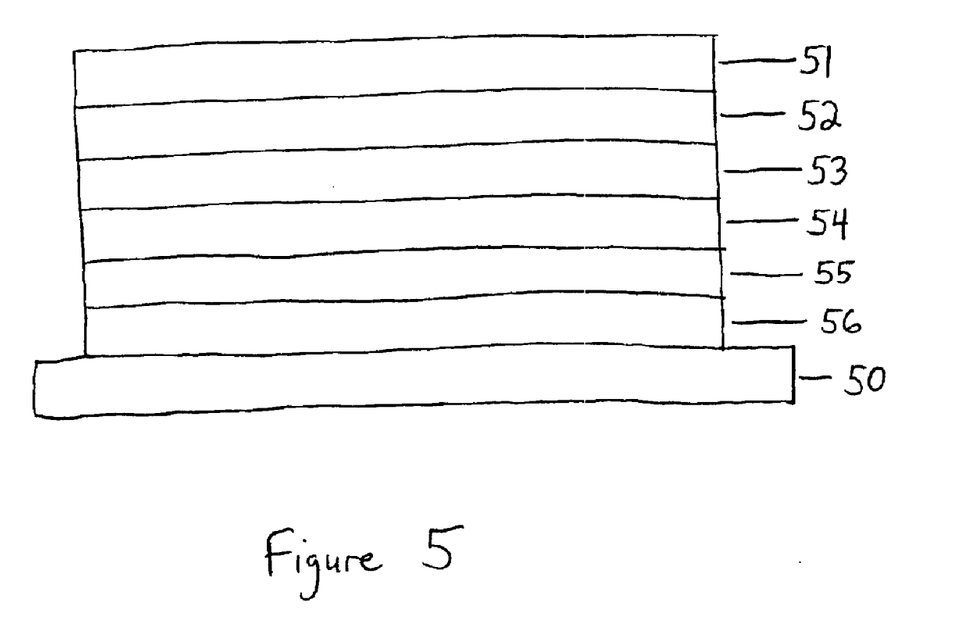
FIG. 5 is a schematic representation of still another embodiment of an OLED according to the present invention.

In another embodiment of the present invention, as shown in FIG. 5, the OLED structure includes an inverted OLED over a substrate 50. In this embodiment, a cathode 56 is positioned over the substrate 50, a second ETL 55 over the cathode 56, a first ETL 54 over the second ETL 55, a second HTL 53 over the first ETL 54, a first HTL 52 over the second HTL 53, and an anode 51 over the first HTL 52. The second HTL 53 and the first ETL 54 are doped with a phosphorescent material. Alternatively, in still another embodiment, an inverted OLED may comprise an HTL doped with a phosphorescent material and an ETL doped with a phosphorescent material.

For example, the first hole transporting layer may function substantially as a hole injecting layer (HIL). The hole injecting materials of the present invention may be characterized as materials that planarize or wet the anode surface so as to provide efficient hole injection from the anode into the hole injecting material. The hole injecting materials of the present invention are further characterized as having HOMO (Highest Occupied Molecular Orbital) energy levels that favorably match up, as defined by their herein-described relative IP energies, with the adjacent anode layer on one side of the HIL layer and the phosphorescent-doped doped hole transporting layer on the opposite side of the HIL.

Preferred properties for the HIL material are such that holes can be efficiently injected from the anode into the HIL material. In particular, the HIL material preferably has an IP not more than about 0.7 eV greater that the IP of the anode material. More preferably, the HIL material has an IP not more than about 0.5 eV greater than the anode material.

The HIL materials are further distinguished from conventional hole transporting materials that are typically used in the hole transporting layer of an OLED in that such HIL materials have a hole mobility that is substantially less than the hole mobility of conventional hole transporting materials. For example, m-MTDATA has been identified as effective in promoting injection of holes from ITO into HTLs consisting of, for example 4,4'-bis[N-(naphthyl)-N-phenyl-amino]biphenyl (α-NPD) or N,N'-bis(3-methylphenyl)-N,N'-diphenyl-[1,1'-biphenyl]4,4'-diamine (TPD), possibly due to reduction of the HTL HOMO level/ITO offset energy, or to wetting of the ITO surface. The HIL material m-MTDATA is believed to have a hole mobility of about $3\times10^{-5}$ cm$^2$/Vsec as compared with the conventional hole transporting materials such as α-NPD or TPD, which have a hole mobility of about $5\times10^{-4}$ cm$^2$/Vsec and $9\times10^{-4}$ cm$^2$/Vsec, respectively. Thus, the m-MTDATA material has a hole mobility more than an order of magnitude less than the commonly used HTL materials α-NPD and TPD.

In those embodiments of the present invention containing two HTLs, the first HTL may include any suitable material that acts as a good transporter of charge (i.e., holes). Suitable hole transporting materials are known in the art, and examples of materials that may be suitable for the first hole transporting layer can be found in U.S. Pat. No. 5,707,745, which is incorporated herein in its entirety by reference. Other materials suitable for use as the first hole transporting layer may include, for example, 4,4'-bis[N-(1-naphthyl)-N- phenyl-amino]biphenyl (α-NPD); N,N'-diphenyl-N,N'-bis(3-methylpheny)1-1'biphenyl-4,4'diamine (TPD); 4,4'-bis[N,N'-(3-tolyl)amino]-3,3'-dimethylbiphenyl (M14); 4,4', 4"-tris 3-methylphenylphenylamino)triphenylamine (MTDATA); and 4,4'-bis[N,N'-(3-tolyl)amino]-3,3'-dimethylbiphenyl (HMTPD). In a preferred embodiment, the first hole transporting layer is 3,3'-Dimethyl-$N^4,N^4,N^{4'},N^{4'}$-tetra-p-tolyl-biphenyl-4,4'-diamine (R854) having the following chemical formula:

The second HTL, which is doped with a phosphorescent material and is an emissive layer (EML), may include any suitable material that acts as a good transporter of charge (i.e., holes) and also efficiently transfers energy to a highly luminescent guest. Suitable hole transporting materials are known in the art, and examples of materials that may be suitable for the second hole transporting layer can be found in U.S. Pat. No. 5,707,745, which, as indicated above, is incorporated herein in its entirety by reference. Other materials suitable for use as the second hole transporting layer may include, for example, 4,4'-bis[N-(1-naphthyl)-N-phenyl-amino]biphenyl (α-NPD); N,N'-diphenyl-N,N'-bis(3-methylpheny)1-1'biphenyl-4,4'diamine (TPD); 4,4'-bis[N,N'-(3-tolyl)amino]-3,3'-dimethylbiphenyl (M14); 4,4'4"-tris(3-methylphenylphenylamino)triphenylamine (MTDATA); and 4,4'-bis[N,N'-(3-tolyl)amino]-3,3'-dimethylbiphenyl (HMTPD). In one preferred embodiment, the second hole transporting layer is 3,3'-Dimethyl-$N^4,N^4,N^{4'},N^{4'}$-tetra-p-tolyl-biphenyl-4,4'-diamine (R854) having the following chemical formula:

The first ETL, which is doped with a phosphorescent material and is an emissive layer (EML), may include any suitable host material that acts as a good transporter of charge (i.e., electrons) and also efficiently transfers energy to a highly luminescent guest. Suitable electron transporting materials are known in the art, and examples of materials that may be suitable for the first electron transporting layer can be found in the co-pending application U.S. Ser. No. 09/629,335 filed on Aug. 1, 2000, which is incorporated herein in its entirety by reference. Examples of materials suitable for use as the first electron transporting layer may include, for example, an oxadiazole such as 1,3-bis(N,N-t-butyl-phenyl)-1,3,4-oxadiazole (OXD-7), an oxadiazole derivative, a phenanthroline such as 2,9-dimethyl-4,7-diphenyl-1,10-phenanthroline (bathocuproine or BCP), a BCP derivative, or a substituted or un-substituted benzoxazole or benzthiazole compound. In a preferred embodiment, the first electron transporting layer is a host material of 3-phenyl-4-(1'-naphthyl)-5-phenyl-1,2,4-triazole (TAZ) having the following chemical formula:

In those embodiments of the present invention containing two ETLs, the second ETL may include any suitable material that acts as a good transporter of charge (i.e., electrons), and that also functions as an effective electron injecting layer (EIL). Suitable electron transporting materials are known in the art, and examples of materials that may be suitable for the second ETL can be found in U.S. Pat. No. 5,707,745, which, as indicated above, is herein incorporated in its entirety by reference. In a preferred embodiment, the second ETL is comprised of the electron transporting material tris-(8-hydroxyquinoline) aluminum ($Alq_3$), which is used to transport electrons into the first electron transporting layer, and has the following chemical formula:

An effective electron injecting layer may be comprised of a phthalocyanine compound, for example, copper phthalocyanine (CuPc).

In addition to functioning as an electron injecting layer, the second ETL may also function as a hole blocking layer and/or as an exciton blocking layer. The hole blocking and/or exciton blocking layer in OLED devices substantially blocks the diffusion of holes and/or excitons, respectively, thus substantially keeping the holes and/or excitons, respectively, within the emissive region of the device so as to enhance device efficiency.

Any phosphorescent emitters may be used as phosphorescent dopants in the present invention. Preferred phosphorescent dopants are those organometallic complexes disclosed in the co-pending application U.S. Ser. No. 09/637,766 filed on Aug. 11, 2000, which is herein incorporated in its entirety by reference. Examples of such preferred phosphorescent dopants include Platinum(II) (2-phenylpyridinato-N,$C^{2'}$) (acetyl acetonate) [Pt(ppy)

(acac)], Platinum(II) (2-(p-tolyl)pyridinato-N,$C^{2'}$) (acetyl acetonate) [Pt(tpy)(acac)], Platinum(II) (7,8-benzoqionolinato-N,$C^{3'}$) (acetyl acetonate) [Pt(bzq)(acac)], Platinum(II) (2-(2'-(4',5'-benzothienyl)pyridinato-N,$C^{3'}$) (acetyl acetonate) [Pt(btp)(acac)], Platinum(II) (2-(4,6'-difluorophenyl)pyridinato-N,$C^{2'}$) (acetyl acetonate) [Pt(4,6-$F_2$ppy)(acac)], Platinum(II) (2-(4',5'-difluorophenyl) pyridinato-N,$C^{2'}$) (acetyl acetonate) [Pt(4,5-$F_2$ppy)(acac)], and Platinum(II) (2-(4',5'-difluorophenyl)pyridinato-N,$C^{2'}$) (2-picolinato) [Pt(4,5-$F_2$ppy)(pico)], whose corresponding chemical structures can be seen below as follows:

Another preferred phosphorescent dopant is Iridium (2-(4', 6'-difluorophenyl)pyridinato-N,$C^{2'}$)(2-picolinato)[Ir(4,6-$F_2$ppy)(pico)], which is used as the phosphorescent dopant in the example of the present invention which is discussed later in this Detailed Description.

In the OLED structures of the present invention, light may be emitted from the substrate side of the device, or alternatively, from the side of the device opposite the substrate, that is, as a top-emitting device. A top-emitting device is one which has an opaque and/or reflective substrate such that light is produced only out of the top of the device and not through the substrate. The substrate is typically referred to as being at the bottom of the device.

Substrates according to the present invention may be opaque or substantially transparent, rigid or flexible, and/or plastic, metal or glass. Although not limited to the thickness ranges recited herein, the substrate may be as thin as 10 mm if present as a flexible plastic or metal foil substrate, or substantially thicker if present as a rigid, transparent or opaque substrate, or if the substrate is made of silicon.

Suitable electrode (i.e., anode and cathode) materials include conductive materials such as a metal, a metal alloy or ITO which form electrical contacts. The deposition of electrical contacts may be accomplished by vapor deposition or other suitable metal deposition techniques. These electrical contacts may be made, for example, from indium, magnesium, platinum, gold, silver or combinations such as Ti/Pt/Au, Cr/Au or Mg/Ag.

When depositing the top electrode layer (i.e., the cathode or the anode, typically the cathode), that is, the electrode on the side of the OLED farthest from the substrate, damage to the organic layers should be avoided. For example, organic layers should not be heated above their glass transition temperature. Top electrodes are preferably deposited from a direction substantially perpendicular to the substrate.

In preferred embodiments, the cathode is preferably a low work function, electron-injecting material, such as a metal layer. Preferably, the cathode material has a work function that is less than about 4 electron volts. The cathode preferably is a metal layer of about 100 Å (angstroms) thick or less, and may be about 50 Å thick or less. The contacts are preferably made of magnesium silver or a magnesium and silver alloy. The metal cathode layer may be substantially thicker if the cathode layer is opaque.

For top-emitting devices, a transparent cathode such as disclosed in U.S. Pat. No. 5,703,436, or co-pending patent applications U.S. Ser. Nos. 08/964,863 and 09/054,707, may be used. A transparent cathode has light transmission characteristics such that the OLED has an optical transmission of at least about 50%. Preferably, the transparent cathode has light transmission characteristics that permit the OLED to have an optical transmission of at least about 70%, more preferably, at least about 85%.

The anode is preferably a high work function hole-injecting metal anode layer, for example, an indium tin oxide (ITO) layer. ITO is a transparent conductor which functions as an anode. ITO is a degenerate semiconductor formed by doping a wide band semiconductor. The carrier concentration of the ITO is in excess of $10^{19}/cm^3$. The ITO anode layer may be about 500 Å to greater than about 4000 Å thick. For top-emitting devices that use an opaque or reflective anode, a high-work-function metal such as Au may be used.

It is desirable for the OLEDs of the present invention to be fabricated using materials that provide electroluminescent emission in a relatively narrow band centered near selected spectral regions, which correspond to one of the three primary colors, red, green and blue so that they may be used as a colored layer in an OLED. It is also desirable that such compounds be capable of being readily deposited as a thin layer using vacuum deposition techniques so that they may be readily incorporated into an OLED that is prepared entirely from vacuum-deposited organic materials.

The OLEDs and OLED structures of the present invention optionally contain additional materials or layers depending on the desired effect, such as protective layers (to protect certain materials during the fabrication process), insulating layers, reflective layers to guide waves in certain directions, and protective caps, which cover the electrodes and organic layers in order to protect these layers from the environment. A description of insulating layers and protective caps is contained for example, in U.S. Pat. No. 6,013,538, which is hereby incorporated by reference in its entirety.

There may be substantial variation of the type, number, thickness and order of the layers that are present, dependent on whether an inverted sequence of OLED layers is present, whether the OLED is intended to produce emission in a preferred spectral region, or whether still other design variations are used.

This invention will now be described in detail with respect to showing how a certain specific representative embodiment thereof can be made, the materials, apparatus and process steps being understood as examples that are intended to be illustrative only. In particular, the invention is not intended to be limited to the methods, materials, conditions, process parameters, apparatus and the like specifically recited herein.

EXAMPLE 1

A first HTL is first deposited onto an ITO (indium tin oxide) coated glass substrate. The first HTL consists of about 400 Å of R854. A second HTL consists of about 200 Å of R854, and is deposited onto the first HTL. The second HTL is about 6% doped with Ir(4,6-$F_2$ppy)(pico). A first ETL consists of about 200 Å of TAZ, and is deposited onto the second HTL. The first ETL is about 6% doped with Ir(4,6-$F_2$ppy)(pico). A second ETL of $Alq_3$ having a thickness of about 400 Å is deposited onto the first ETL. The device is finished by depositing a Mg/Ag electrode onto the second ETL. This Mg/Ag electrode has a thickness of about 100 nm. All of the depositions are carried out at a vacuum less than $5 \times 10^{-5}$ Torr. The devices are tested in air, without packaging.

Figure 1:
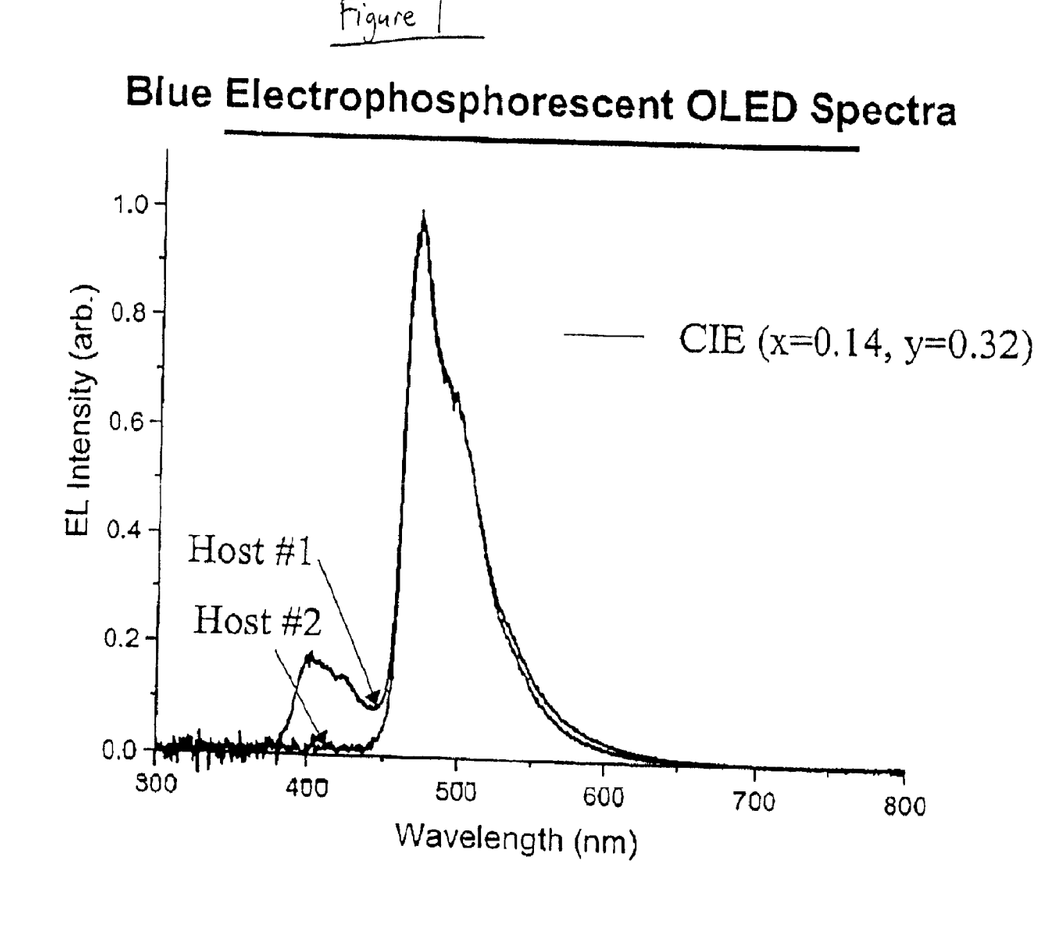
FIG. 1 is a graph showing the electroluminescent (EL) intensity as a function of wavelength for: (1) an OLED having a ITO/R854 (450 Å)/TAZ:6%-Ir(4,6-$F_2$ppy)(pico) (250 Å)/Alq$_3$ (450 Å)/MgAg layer structure (Host #1); and (2) an OLED having a ITO/R854 (400 Å)/R854:6%-Ir(4,6-$F_2$ppy)(pico) (200 Å)/TAZ:6%-Ir(4,6-$F_2$ppy)(pico) (200 Å)/Alq$_3$ (400 Å)/MgAg layer structure (Host #2).

FIG. 1 shows a depiction of the EL intensity as a function of wavelength for two different OLEDs. The first OLED (Host #1) has a ITO/R854 (450 Å)/TAZ:6%-Ir(4,6-$F_2$ppy) (pico) (250 Å)/$Alq_3$(450 Å)/MgAg layer structure, and the second OLED (Host #2) has a structure according to Example 1 above. That is, the first OLED and the second OLED are similar in structure except that the first OLED lacks the second hole transporting layer doped with a phosphorescent material which is present in the second OLED, representative of Example 1. As can be seen in FIG. 1, although both OLEDs display a peak EL intensity at about 472 nm, the first OLED (lacking the second HTL doped with a phosphorescent material) has an additional peak intensity at about 400 nm. Elimination of this additional peak helps to enhance overall device efficiency. Furthermore, it is believed that use of adjacent phosphorescent-doped layers may also help enhance device efficiency by eliminating exciplex formation.

Figure 2:
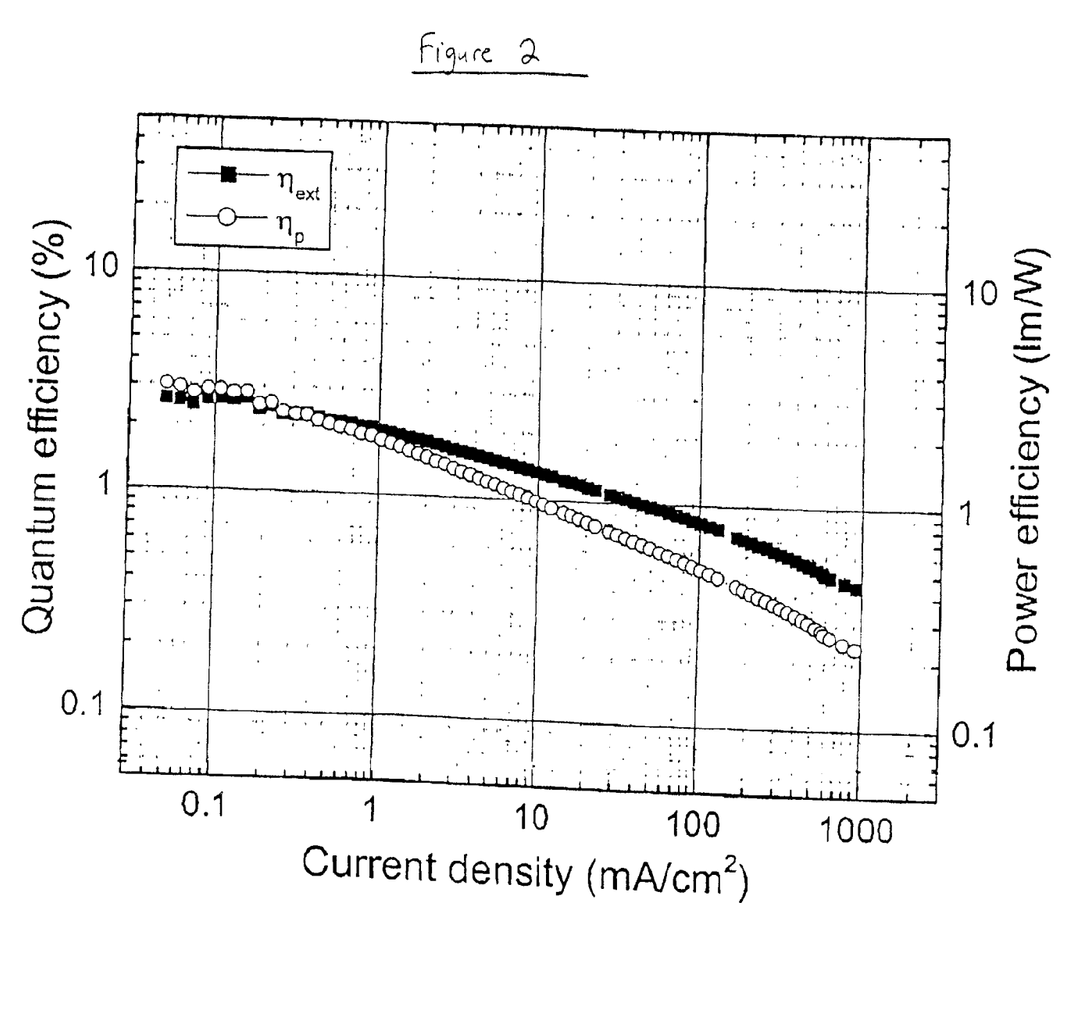
FIG. 2 is a graph showing: (1) the external quantum efficiency ($\eta_{ext}$) as a function of current density, and (2) the power efficiency ($\eta_p$) as a function of current density, each for an OLED having a ITO/R854 (400 Å)/R854:6%-Ir(4,6-$F_2$ppy)(pico) (200 Å)/TAZ:6%-Ir (4,6-$F_2$ppy)(pico) (200 Å)/Alq$_3$ (400 Å)/MgAg layer structure.

FIG. 2 shows the external quantum efficiency ($\eta_{ext}$) of a 6%-Ir(4,6-$F_2$ppy) (pico)-doped R854/6%-Ir(4,6-$F_2$ppy) (pico)-doped TAZ device. A maximum $\eta_{ext}$ of about 2% was obtained, at a current density of about 0.1 to 1.0 mA/$cm^2$, with CIE values of X=0.14 and Y=0.32.

It is believed this is the first reported evidence of electrophosphorescence in the blue region of the spectrum. Furthermore, it is believed that an external quantum efficiency of 2% shows that still higher quantum efficiencies may ultimately be achieved using the materials and device structures as described herein to produce blue electrophosphorescence.

FIG. 2 also shows the power efficiency ($\eta_p$) of a 6%-Ir (4,6-$F_2$ppy)(pico)-doped R854/6%-Ir(4,6-$F_2$ppy)(pico)-doped TAZ device. A maximum $\eta_p$ of about 2.5 lm/W was obtained, at a current density of about 0.1 mA/$cm^2$.

The structures of the present invention may be used for example, in substantially any type of device that includes one or more OLEDs including billboards and signs, computer monitors, vehicles, telecommunications devices, telephones, printers televisions, large area wall screens, theater screens and stadium screens.

While the present invention is described with respect to particular examples and preferred embodiments, it is understood that the present invention is not limited to these examples and embodiments. In particular, the present invention may be applied to a wide variety of electronic devices. The present invention as claimed therefore includes variations from the particular examples and preferred embodiments described herein, as will be apparent to one of skill in the art.

We claim:

1. An organic light emitting device comprising:
   an anode;
   a hole transporting layer over the anode, wherein the hole transporting layer is doped with a phosphorescent material;
   an electron transporting layer over the hole transporting layer, wherein the electron transporting layer is doped with the phosphorescent material; and
   a cathode over the electron transporting layer.

2. The organic light emitting device of claim 1, wherein the organic light emitting device emits light in the blue range of the visible spectrum.

3. The organic light emitting device of claim 1, wherein the hole transporting layer comprises a member of the group consisting of 4,4'-bis[N-(1-naphthyl)-N-phenyl-amino] biphenyl (α-NPD), N,N'-diphenyl-N,N'-bis(3-methylpheny) 1-1'biphenyl-4,4'diamine (TPD), 4,4'-bis[N,N'-(3-tolyl) amino]-3,3'-dimethylbiphenyl (M14), 4,4',4"-tris(3-methylphenylphenylamino)triphenylamine (MTDATA), 4,4'-bis[N,N'-(3-tolyl)amino]-3,3'-dimethylbiphenyl (HMTPD), and 3,3'-Dimethyl-$N^4$,$N^4$,$N^{4'}$,$N^{4'}$-tetra-p-tolyl-biphenyl-4,4'-diamine (R854).

4. The organic light emitting device of claim 1, wherein the electron transporting layer comprises a member of the group consisting of an oxadiazole, an oxadiazole derivative, a phenanthroline, a substituted benzoxazole, an un-substituted benzoxazole, a substituted benzthiazole, and an un-substituted benzthiazole compound.

5. The organic light emitting device of claim 1, wherein the electron transporting layer comprises a member of the group consisting of 1,3-bis(N,N-t-butyl-phenyl)-1,3,4-oxadiazole (OXD-7), 2,9-dimethyl-4,7-diphenyl-1,10-phenanthroline (bathocuproine or BCP), a BCP derivative, and 3-phenyl-4-(1'-naphthyl)-5-phenyl-1,2,4-triazole (TAZ).

6. The organic light emitting device of claim 1, wherein the phosphorescent material comprises a member of the group consisting of Platinum(II) (2-phenylpyridinato-N,$C^{2'}$) (acetyl acetonate) [Pt(ppy)(acac)], Platinum(II) (2-(p-tolyl) pyridinato-N,$C^{2'}$) (acetyl acetonate) [Pt(ppy)(acac)], Platinum(II) (7,8-benzoqionolinato-N,$C^{3'}$) (acetyl acetonate) [Pt(bzq)(acac)], Platinum(II) (2-(2'-(4',5'-benzothienyl)pyridinato-N,$C^{3'}$) (acetyl acetonate) [Pt(btp) (acac)], Platinum(II) (2-(4',6'-difluorophenyl)pyridinato-N, $C^{2'}$) (acetyl acetonate) [Pt(4,6-$F_2$ppy)(acac)], Platinum(II) (2-(4',5'-difluorophenyl)pyridinato-N,$C^{2'}$) (acetyl acetonate)

[Pt(4,5-F$_2$ppy)(acac)], Platinum(II) (2-(4',5'-difluorophenyl) pyridinato-N,C$^{2'}$) (2-picolinato) [Pt(4,5-F$_2$ppy)(pico)], and Iridium (2-(4',6'-difluorophenyl)pyridinato-N,C$^{2'}$) (2-picolinato) [Ir(4,6-F$_2$ppy)(pico)].

7. The organic light emitting device of claim 1, wherein the cathode comprises a member of the group consisting of magnesium silver and a magnesium silver alloy, and the anode comprises indium tin oxide (ITO).

8. An electronic device incorporating the organic light emitting device of claim 1, the electronic device selected from the group consisting of a billboard, a sign, a computer monitor, a vehicle, a telecommunications device, a telephone, a printer, a television, a large area wall screen, a theater screen and a stadium screen.

9. An organic light emitting device comprising:
   an anode;
   a first hole transporting layer over the anode;
   a second hole transporting layer over the first hole transporting layer, wherein the second hole transporting layer is doped with a phosphorescent material;
   a first electron transporting layer over the second hole transporting layer, wherein the first electron transporting layer is doped with the phosphorescent material;
   a second electron transporting layer over the first electron transporting layer; and
   a cathode over the second electron transporting layer.

10. The organic light emitting device of claim 9, wherein the organic light emitting device emits light in the blue range of the visible spectrum.

11. The organic light emitting device of claim 9, wherein the first hole transporting layer comprises a member of the group consisting of 4,4'-bis[N-(1-naphthyl)-N-phenyl-amino]biphenyl (α-NPD), N,N'-diphenyl-N,N'-bis(3-methylpheny) 1-1'biphenyl-4,4'diamine (TPD), 4,4'-bis[N, N'-(3-tolyl)amino]-3,3'-dimethylbiphenyl (M14), 4,4',4"-tris (3-methylphenylphenylamino)triphenylanine (MTDATA), 4,4'-bis[N,N'-(3-tolyl)amino]-3,3'-dimethylbiphenyl (HMTPD), and 3,3'-Dimethyl-N$^4$,N$^4$,N$^{4'}$,N$^{4'}$-tetra-p-tolyl-biphenyl-4,4'-diamine (R854), and wherein the second hole transporting layer comprises a member of the group consisting of 4,4'-bis[N-(1-naphthyl)-N-phenyl-amino]biphenyl (α-NPD), N,N'-diphenyl-N,N'-bis(3-methylpheny)1-1'biphenyl-4,4'diamine (TPD), 4,4'-bis[N,N'-(3-tolyl) amino]-3,3'-dimethylbiphenyl (M14), 4,4',4"-tris(3-methylphenylphenylamino)triphenylamine (MTDATA), 4,4'-bis[N,N'-(3-tolyl)amino]-3,3'-dimethylbiphenyl (HMTPD), and 3,3'-Dimethyl-N$^4$,N$^4$,N$^{4'}$,N$^{4'}$-tetra-p-tolyl-biphenyl-4,4'-diamine (R854).

12. The organic light emitting device of claim 9, wherein the first hole transporting layer has an IP energy not more than about 0.7 eV greater than the IP energy of the anode.

13. The organic light emitting device of claim 12, wherein the first hole transporting layer has an IP energy not more than about 0.5 eV greater than the IP energy of the anode.

14. The organic light emitting device of claim 9, wherein the first electron transporting layer comprises a member of the group consisting of an oxadiazole, an oxadiazole derivative, a phenanthroline, a substituted benzoxazole, an un-substituted benzoxazole, a substituted benzthiazole, and an un-substituted benzthiazole compound, and wherein the second electron transporting layer comprises a member of the group consisting of tris-(8-hydroxyquinoline)aluminum (Alq$_3$) and a phthalocyanine compound.

15. The organic light emitting device of claim 9, wherein the first electron transporting layer comprises a member of the group consisting of 1,3-bis(N,N-t-butyl-phenyl)-1,3,4-oxadiazole (OXD-7), 2,9-dimethyl-4,7-diphenyl-1,10-phenanthroline (bathocuproine or BCP), a BCP derivative, and 3-phenyl-4-(1'-naphthyl)-5-phenyl-1,2,4-triazole (TAZ), and wherein the second electron transporting layer comprises copper phthalocyanine (CuPc).

16. The organic light emitting device of claim 9, wherein the phosphorescent material comprises a member of the group consisting of Platinum(II) (2-phenylpyridinato-N,C$^{2'}$) (acetyl acetonate) [Pt(ppy)(acac)], Platinum(II) (2-(p-tolyl) pyridinato-N,C$^{2'}$) (acetyl acetonate) [Pt(tpy)(acac)], Platinum(II) (7,8-benzoqionolinato-N,C$^{3'}$) (acetyl acetonate) [Pt(bzq)(acac)], Platinum(II) (2-(2'-(4',5'-benzothienyl)pyridinato-N,C$^{3'}$) (acetyl acetonate) [Pt(btp) (acac)], Platinum(II) (2-(4',6'-difluorophenyl)pyridinato-N, C$^{2'}$) (acetyl acetonate) [Pt(4,6-F$_2$ppy)(acac)], Platinum(II) (2-(4',5'-difluorophenyl)pyridinato-N,C$^{2'}$) (acetyl acetonate) [Pt(4,5-F$_2$ppy)(acac)], Platinum(II) (2-(4',5'-difluorophenyl) pyridinato-N,C$^{2'}$) (2-picolinato) [Pt(4,5-F$_2$ppy)(pico)], and Iridium (2-(4',6'-difluorophenyl)pyridinato-N,C$^{2'}$) (2-picolinato) [Ir(4,6-F$_2$ppy )(pico )].

17. The organic light emitting device of claim 9, wherein the cathode comprises a member of the group consisting of magnesium silver and a magnesium silver alloy, and the anode comprises indium tin oxide (ITO).

18. An electronic device incorporating the organic light emitting device of claim 9, the electronic device selected from the group consisting of a billboard, a sign, a computer monitor, a vehicle, a telecommunications device, a telephone, a printer, a television, a large area wall screen, a theater screen and a stadium screen.

19. An organic light emitting device comprising:
   a substrate;
   an anode over the substrate;
   a first hole transporting layer over the anode;
   a second hole transporting layer over the first hole transporting layer, wherein the second hole transporting layer is doped with a phosphorescent material;
   a first electron transporting layer over the second hole transporting layer, wherein the first electron transporting layer is doped with the phosphorescent material;
   a second electron transporting layer over the first electron transporting layer; and
   a cathode over the second electron transporting layer.

20. The organic light emitting device of claim 19, wherein the organic light emitting device emits light in the blue range of the visible spectrum.

21. The organic light emitting device of claim 19, wherein the first hole transporting layer comprises a member of the group consisting of 4,4'-bis[N-(1-naphthyl)-N-phenyl-amino]biphenyl (α-NPD), N,N'-diphenyl-N,N'-bis(3-methylpheny) 1-1'biphenyl-4,4'diamine (TPD), 4,4'-bis[N, N'-(3-tolyl)amino]-3,3'-dimethylbiphenyl (M14), 4,4',4"-tris (3-methylphenylphenylamino)triphenylamine (MTDATA), 4,4'-bis[N,N'-(3-tolyl)amino]-3,3'-dimethylbiphenyl (HMTPD), and 3,3'-Dimethyl-N$^4$,N$^4$,N$^{4'}$,N$^{4'}$-tetra-p-tolyl-biphenyl-4,4'-diamine (R854), and wherein the second hole transporting layer comprises a member of the group consisting of 4,4'-bis[N-(1-naphthyl)-N-phenyl-amino]biphenyl (α-NPD), N,N'-diphenyl-N,N'-bis(3-methylpheny)1-1'biphenyl-4,4'diamine (TPD), 4,4'-bis[N,N'-(3-tolyl) amino]-3,3'-dimethylbiphenyl (M14), 4,4',4"-tris(3-methylphenylphenylamino)triphenylamine (MTDATA), 4,4'-bis[N,N'-(3-tolyl)amino]-3,3'-dimethylbiphenyl (HMTPD), and 3,3'-Dimethyl-N$^4$,N$^4$,N$^{4'}$, N$^{4'}$-tetra-p-tolyl-biphenyl-4,4'-diamine (R854).

22. The organic light emitting device of claim 19, wherein the first hole transporting layer has an IP energy not more than about 0.7 eV greater than the IP energy of the anode.

23. The organic light emitting device of claim 22, wherein the first hole transporting layer has an IP energy not more than about 0.5 eV greater than the IP energy of the anode.

24. The organic light emitting device of claim 19, wherein the first electron transporting layer comprises a member of the group consisting of an oxadiazole, an oxadiazole derivative, a phenanthroline, a substituted benzoxazole, an un-substituted benzoxazole, a substituted benzthiazole, and an un-substituted benzthiazole compound, and wherein the second electron transporting layer comprises a member of the group consisting of tris-(8-hydroxyquinoline)aluminum ($Alq_3$) and a phthalocyanine compound.

25. The organic light emitting device of claim 19, wherein the first electron transporting layer comprises a member of the group consisting of 1,3-bis(N,N-t-butyl-phenyl)-1,3,4-oxadiazole (OXD-7), 2,9-dimethyl-4,7-diphenyl-1,10-phenanthroline (bathocuproine or BCP), a BCP derivative, and 3-phenyl-4-(1'-naphthyl)-5-phenyl-1,2,4-triazole (TAZ), and wherein the second electron transporting layer comprises copper phthalocyanine (CuPc).

26. The organic light emitting device of claim 19, wherein the phosphorescent material comprises a member of the group consisting of Platinum(II) (2-phenylpyridinato-N,$C^{2'}$) (acetyl acetonate) [Pt(ppy)(acac)], Platinum(II) (2-(p-tolyl) pyridinato-N,$C^{2'}$) (acetyl acetonate) [Pt(tpy)(acac)], Platinum(II) (7,8-benzoqionolinato-N,$C^{3'}$) (acetyl acetonate) [Pt(bzq)(acac)], Platinum(II) (2-(2'-(4',5'-benzothienyl)pyridinato-N,$C^{3'}$) (acetyl acetonate) [Pt(btp) (acac)], Platinum(II) (2-(4',6'-difluorophenyl)pyridinato-N, $C^{2'}$) (acetyl acetonate) [Pt(4,6-$F_2$ppy)(acac)], Platinum(II) (2-(4',5'-difluorophenyl)pyridinato-N,$C^{2'}$) (acetyl acetonate) [Pt(4,5-$F_2$ppy)(acac)], Platinum(II) (2-(4',5'-difluorophenyl) pyridinato-N,$C^{2'}$) (2-picolinato) [Pt(4,5-$F_2$ppy)(pico)], and Iridium (2-(4',6'-difluorophenyl)pyridinato-N,$C^{2'}$) (2-picolinato) [Ir(4,6-$F_2$ppy)(pico)].

27. The organic light emitting device of claim 19, wherein the cathode comprises a member of the group consisting of magnesium silver and a magnesium silver alloy, and the anode comprises indium tin oxide (ITO).

28. The organic light emitting device of claim 19, wherein the substrate comprises a member of the group consisting of plastic, metal and glass.

29. The organic light emitting device of claim 19, wherein the substrate is substantially transparent.

30. The organic light emitting device of claim 19, wherein the substrate is opaque, and the cathode is transparent.

31. An electronic device incorporating the organic light emitting device of claim 19, the electronic device selected from the group consisting of a billboard, a sign, a computer monitor, a vehicle, a telecommunications device, a telephone, a printer, a television, a large area wall screen, a theater screen and a stadium screen.

32. An organic light emitting device comprising:
a substrate;
a cathode over the substrate;
a first electron transporting layer over the cathode;
a second electron transporting layer over the first electron transporting layer, wherein the second electron transporting layer is doped with a phosphorescent material;
a first hole transporting layer over the second electron transporting layer, wherein the first hole transporting layer is doped with the phosphorescent material;
a second hole transporting layer over the first hole transporting layer; and
an anode over the second hole transporting layer.

33. The organic light emitting device of claim 32, wherein the organic light emitting device emits light in the blue range of the visible spectrum.

34. The organic light emitting device of claim 32, wherein the first hole transporting layer comprises a member of the group consisting of 4,4'-bis[N-(1-naphthyl)-N-phenyl-amino]biphenyl (α-NPD), N,N'-diphenyl-N,N'-bis(3-methylpheny)1-1'biphenyl-4,4'diamine (TPD), 4,4'-bis[N, N'-(3-tolyl)amino]-3,3'-dimethylbiphenyl (M14), 4,4',4''-tris(3-methylphenylphenylamino)triphenylamine (MTDATA), 4,4'-bis[N,N'-(3-tolyl)amino]-3,3'-dimethylbiphenyl (HMTPD), and 3,3'-Dimethyl-$N^4,N^4,N^{4'},N^{4'}$-tetra-p-tolyl-biphenyl-4,4'-diamine (R854), and wherein the second hole transporting layer comprises a member of the group consisting of 4,4'-bis[N-(1-naphthyl)-N-phenyl-amino]biphenyl (α-NPD), N,N'-diphenyl-N,N'-bis(3-methylpheny)1-1'biphenyl-4,4'diamine (TPD), 4,4'-bis[N,N'-(3-tolyl) amino]-3,3'-dimethylbiphenyl (M14), 4,4',4''-tris(3-methylphenylphenylamino)triphenylamine (MTDATA), 4,4'-bis[N,N'-(3-tolyl)amino]-3,3'-dimethylbiphenyl (HMTPD), and 3,3'-Dimethyl-$N^4,N^4,N^{4'},N^{4'}$-tetra-p-tolyl-biphenyl-4,4'-diamine (R854).

35. The organic light emitting device of claim 32, wherein the second hole transporting layer has an IP energy not more than about 0.7 eV greater than the IP energy of the anode.

36. The organic light emitting device of claim 35, wherein the second hole transporting layer has an IP energy not more than about 0.5 eV greater than the IP energy of the anode.

37. The organic light emitting device of claim 32, wherein the second electron transporting layer comprises a member of the group consisting of an oxadiazole, an oxadiazole derivative, a phenanthroline, a substituted benzoxazole, an un-substituted benzoxazole, a substituted benzthiazole, and an un-substituted benzthiazole compound, and wherein the first electron transporting layer comprises a member of the group consisting of tris-(8-hydroxyquinoline)aluminum ($Alq_3$) and a phthalocyanine compound.

38. The organic light emitting device of claim 32, wherein the second electron transporting layer comprises a member of the group consisting of 1,3-bis(N,N-t-butyl-phenyl)-1,3, 4-oxadiazole (OXD-7), 2,9-dimethyl-4,7-diphenyl-1,10-phenanthroline (bathocuproine or BCP), a BCP derivative, and 3-phenyl-4-(1'-naphthyl)-5-phenyl-1, 2,4-triazole (TAZ), and wherein the first electron transporting layer comprises copper phthalocyanine (CuPc).

39. The organic light emitting device of claim 32, wherein the phosphorescent material comprises a member of the group consisting of Platinum(II) (2-phenylpyridinato-N,$C^{2'}$) (acetyl acetonate) [Pt(ppy)(acac)], Platinum(II) (2-(p-tolyl) pyridinato-N,$C^{2'}$) (acetyl acetonate) [Pt(tpy)(acac)], Platinum(II) (7,8-benzoqionolinato-N,$C^{3'}$) (acetyl acetonate) [Pt(bzq)(acac)], Platinum(II) (2-(2'-(4',5'-benzothienyl)pyridinato-N,$C^{3'}$) (acetyl acetonate) [Pt(btp) (acac)], Platinum(II) (2-(4',6'-difluorophenyl)pylidinato-N, $C^{2'}$) (acetyl acetonate) [Pt(4,6-$F_2$ppy)(acac)], Platinum(II) (2-(4',5'-difluorophenyl)pyridinato-N,$C^{2'}$) (acetyl acetonate) [Pt(4,5-$F_2$ppy)(acac)], Platinum(II) (2-(4',5'-difluorophenyl) pyridinato-N,$C^{2'}$) (2-picolinato) [Pt(4,5-$F_2$ppy)(pico)], and Iridium (2-(4',6'-difluorophenyl)pyridinato-N,$C^{2'}$) (2-picolinato) [Ir(4,6-$F_2$ppy)(pico)].

40. The organic light emitting device of claim 32, wherein the cathode comprises a member of the group consisting of magnesium silver and a magnesium silver alloy, and the anode comprises indium tin oxide (ITO).

41. The organic light emitting device of claim 32, wherein the substrate comprises a member of the group consisting of plastic, metal and glass.

42. The organic light emitting device of claim 32, wherein the substrate is substantially transparent.

43. The organic light emitting device of claim 32, wherein the substrate is opaque, and the anode is transparent.

44. An electronic device incorporating the organic light emitting device of claim 32, the electronic device selected from the group consisting of a billboard, a sign, a computer monitor, a vehicle, a telecommunications device, a telephone, a printer, a television, a large area wall screen, a theater screen and a stadium screen.

* * * * *

UNITED STATES PATENT AND TRADEMARK OFFICE
CERTIFICATE OF CORRECTION

PATENT NO. : 6,867,538 B2
DATED : March 15, 2005
INVENTOR(S) : Chihaya Adachi et al.

It is certified that error appears in the above-identified patent and that said Letters Patent is hereby corrected as shown below:

Column 2,
Line 25, change "dopant,fac" to -- dopant, fac --.

Signed and Sealed this

Twenty-third Day of August, 2005

JON W. DUDAS
*Director of the United States Patent and Trademark Office*